(12) United States Patent
Balasubramaniam et al.

(10) Patent No.: US 7,169,440 B2
(45) Date of Patent: Jan. 30, 2007

(54) METHOD FOR REMOVING PHOTORESIST AND ETCH RESIDUES

(75) Inventors: Vaidyanathan Balasubramaniam, Beverly, MA (US); Masaaki Hagiwara, Beverly, MA (US); Eiichi Nishimura, Malden, MA (US); Kouichiro Inazawa, Nirasakishi Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 84 days.

(21) Appl. No.: 10/259,768

(22) Filed: Sep. 30, 2002

(65) Prior Publication Data
US 2003/0192856 A1 Oct. 16, 2003

Related U.S. Application Data

(60) Provisional application No. 60/372,446, filed on Apr. 16, 2002.

(51) Int. Cl.
*B05D 5/06* (2006.01)
(52) U.S. Cl. ............... 427/162; 427/534; 427/535; 427/536; 427/539; 427/44; 216/37; 216/49; 216/58; 216/59; 216/60; 216/63; 216/64; 216/67; 216/72; 134/1.1; 134/1.2; 438/710; 438/714; 438/725; 438/734
(58) Field of Classification Search ............... 427/534, 427/535, 536, 539, 444; 216/37, 49, 58, 216/59, 60, 63, 64, 67, 72; 134/1.1, 1.2; 438/710, 714, 725, 734
See application file for complete search history.

(56) References Cited

U.S. PATENT DOCUMENTS

| | | | |
|---|---|---|---|
| 4,844,775 A * | 7/1989 | Keeble | ............ 216/68 |
| 5,877,032 A | 3/1999 | Guinn et al. | |
| 6,040,248 A | 3/2000 | Chen et al. | |
| 6,057,247 A * | 5/2000 | Imai et al. | ............ 438/714 |
| 6,103,074 A * | 8/2000 | Khominich | ............ 204/192.38 |
| 6,372,655 B2 | 4/2002 | Khan et al. | |

(Continued)

FOREIGN PATENT DOCUMENTS

JP 2001-7094 A 1/2001

(Continued)

OTHER PUBLICATIONS

"Introduction to Semiconductor Manufacturing Technology" by Hong Xiao (2001).

*Primary Examiner*—Alain L. Bashore
(74) *Attorney, Agent, or Firm*—Oblon, Spivak, McClelland, Maier & Neustadt, P.C.

(57) ABSTRACT

A method is provided for plasma ashing to remove photoresist remnants and etch residues that are formed during preceding plasma etching of dielectric layers. The ashing method uses a two-step plasma process involving an oxygen-containing gas, where low or zero bias is applied to the substrate in the first cleaning step to remove significant amount of photoresist remnants and etch residues from the substrate, in addition to etching and removing detrimental fluoro-carbon residues from the chamber surfaces. An increased bias is applied to the substrate in the second cleaning step to remove the remains of the photoresist and etch residues from the substrate. The two-step process reduces the memory effect commonly observed in conventional one-step ashing processes. A method of endpoint detection can be used to monitor the ashing process.

38 Claims, 6 Drawing Sheets

U.S. PATENT DOCUMENTS

| | | | |
|---|---|---|---|
| 6,379,574 B1 | 4/2002 | Ou-Yang et al. | |
| 6,440,864 B1 | 8/2002 | Kropewnicki et al. | |
| 6,491,042 B1 * | 12/2002 | Young et al. | 134/1.1 |
| 6,815,362 B1 * | 11/2004 | Wong et al. | 438/706 |
| 6,831,018 B2 * | 12/2004 | Kanegae | 438/706 |
| 6,962,883 B2 * | 11/2005 | Nag et al. | 438/788 |
| 2001/0006849 A1 | 7/2001 | Sukuki | |
| 2001/0008226 A1 | 7/2001 | Hung et al. | |
| 2003/0194876 A1 * | 10/2003 | Balasubramaniam et al. | 438/725 |

FOREIGN PATENT DOCUMENTS

| | | |
|---|---|---|
| KR | 1997-0052637 | 7/1997 |
| TW | 394989 B | 6/2000 |
| TW | 420857 B | 2/2001 |
| WO | WO 00/26954 A1 * | 5/2000 |

* cited by examiner

METHOD FOR REMOVING PHOTORESIST AND ETCH RESIDUES

CROSS-REFERENCE TO RELATED APPLICATIONS

The present application is related to and claims priority to U.S. provisional application serial No. 60/372,446 filed on Apr. 16, 2002, the entire contents of which are herein incorporated by reference. The present application is related to co-pending U.S. patent application Ser. No. 10/259,381, entitled "Method for removing photoresist and etch residues", filed on even date herewith, the entire contents of which are herein incorporated by reference.

FIELD OF THE INVENTION

The present invention is related to plasma processing, particularly to cleaning and removal of photoresist and etch residues following an etch process in semiconductor microfabrication.

BACKGROUND OF THE INVENTION

Plasma processing systems are used in the manufacture and processing of semiconductors, integrated circuits, displays, and other devices or materials to both remove material from or to deposit material on a substrate such as a semiconductor substrate. Plasma processing of semiconductor substrates to transfer a pattern of an integrated circuit from the photolithographic mask to the substrate, or to deposit dielectric or conductive films on the substrate, have become standard methods in the industry.

In semiconductor processing, where various types of films are etched, integration challenges and trade-offs still remain. Conventionally, a dielectric layer is patterned with openings for depositing conductive materials to form vertical contacts. During the patterning process, etch resistant photoresist layer and/or a hard mask layer is deposited over the dielectric layer, exposed to a selected pattern and developed. The layered structure is then etched in a plasma environment where the patterned photoresist layer defines openings in the dielectric layer.

Following the etch step, photoresist remnants and etch residues (e.g., polymer debris) are frequently observed on the etched features and chamber surfaces. One of the integration challenges in plasma cleaning (also known as in-situ ashing), is to successfully remove photoresist remnants and etch residues, while avoiding erosion of surrounding layers. Known systems have used a one-step ashing process in which the bias applied to the substrate is maintained constant throughout the ashing process.

Halocarbon gases are commonly used in the etching of dielectric layers, such as oxides and newer SiOC-containing low-k dielectric materials. These gases are known to generate fluorocarbon polymer etch products, that can deposit on the internal surfaces of the process chamber, as well as on the substrate surface, during the dielectric etch process.

Figure 1:
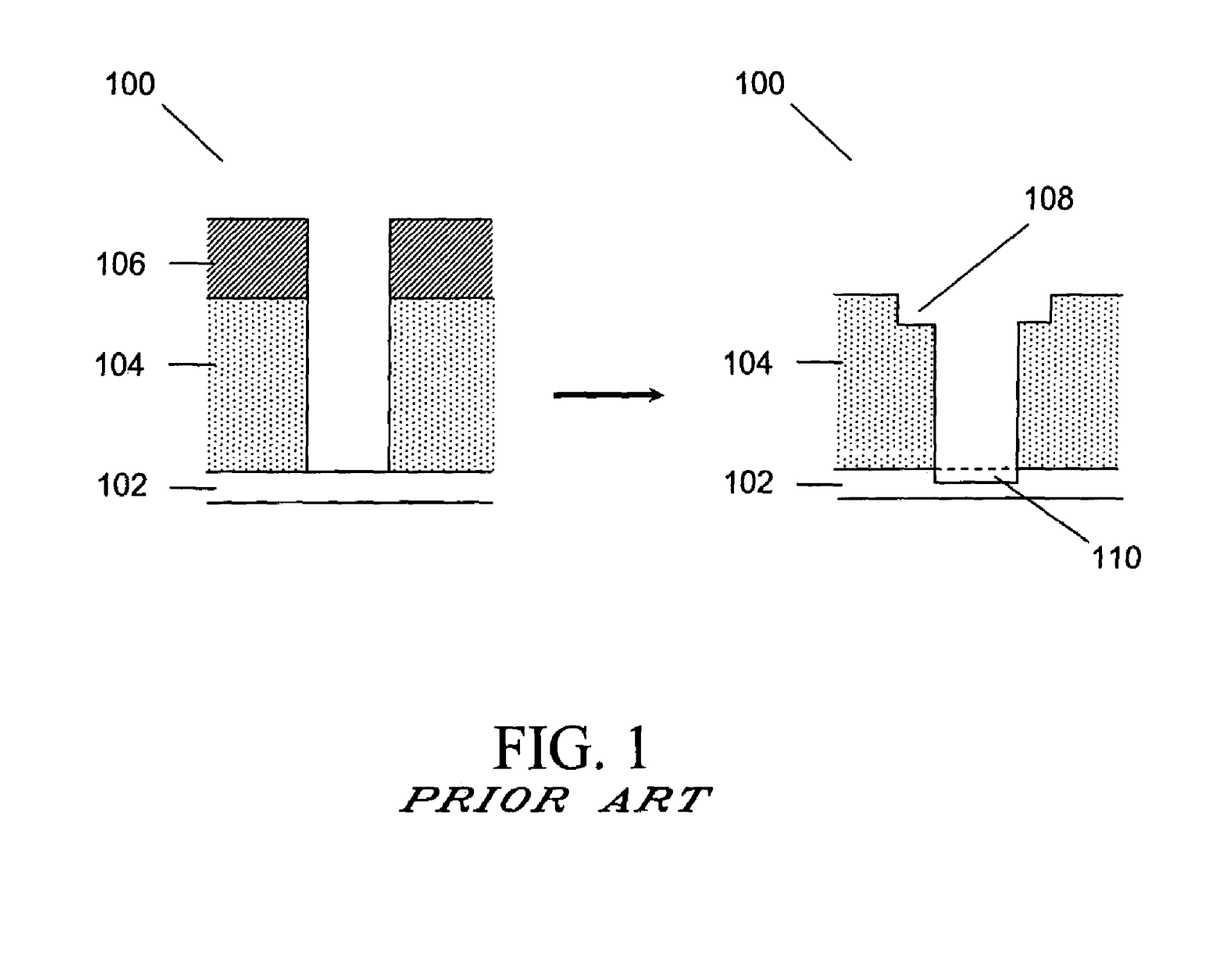
FIG. 1 shows an exemplary cross-sectional representation of a one-step ashing process.

FIG. 1 shows an exemplary cross-sectional representation of a one-step ashing process. During a conventional one-step ash process for removing photoresist 106 from structure 100, fluorocarbon polymers are released/etched from the chamber walls (commonly referred to as a memory effect) and can attack underlying dielectric layer 104 and cap layer 102 (e.g., SiN, SiC), leading towards faceting 108 of the dielectric layer and cap layer loss 110, sometimes even punching through the cap layer 102 and attacking the underlying conductive layer (e.g., copper). This effect can be very high at the edges of a wafer due to high fluorocarbon polymer concentration near the chamber walls. Alternatively, the structure 100 can also contain fluoro-carbon polymer deposits.

During a conventional one-step ash process, photoresist can be removed in an oxygen-containing plasma. To avoid post-ash residue formation, some bias power is applied to the substrate holder. During this process, the fluorocarbon deposits on the chamber walls from the preceding dielectric etch are also etched, releasing fluorine radicals in the plasma. As bias is applied to the substrate holder, these fluorine radicals can erode the underlying dielectric film and consume the cap layer. By reducing the bias or applying zero bias, dielectric film erosion and cap layer consumption can be reduced but post-ash residue can still be observed.

A conventional one-step ash process, that can result in the above chamber problems, can involve the following plasma process conditions: Chamber pressure=50 mTorr, RF bias=150 W, $O_2$ flow rate=200 sccm.

In semiconductor manufacturing, the conventional one-step ash process is frequently carried out in a process chamber where the internal chamber surfaces (and the substrate to be ashed) can contain fluoro-carbon-based polymer deposits from a preceding dielectric etch process. Alternatively, the one-step ash process can be carried out in a process chamber that has been cleaned of polymer deposits from a prior etch process.

SUMMARY OF THE INVENTION

It is an object of the invention to provide a plasma processing method for removing photoresist remnants and etch residues from a substrate with reduced erosion of the surrounding substrate layers compared to one-step ashing.

The above and other objectives are accomplished using a two-step in-situ plasma ashing process utilizing a process gas comprising an oxygen-containing gas. During the first ashing step, a first low or zero bias level is applied to the substrate holder upon which a substrate resides, while a second bias level is applied during the second ashing step.

During the first ashing step, where low or zero bias is applied to the substrate, a significant amount of photoresist remnants and etch residues on the substrate and internal surfaces/walls of the process chamber are etched and removed from the chamber, while erosion of the remaining substrate layers is minimized. During the second ashing step, an increased bias is applied and the ashing process is continued until the photoresist remnants and etch residues are removed.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DETAILED DESCRIPTION OF AN EMBODIMENT

In one embodiment of the invention, a two-step plasma ashing process is utilized to remove photoresist remnants and etch residues from a processing chamber. During the first ashing step, where zero or low bias is applied to a substrate holder upon which a substrate resides, a significant amount of photoresist remnants and etch residues, from a preceding etch process, are etched and removed from the chamber with minimal erosion of the remaining substrate layers. During the second ashing step, an increased bias is applied to the substrate holder and the ashing process is continued until the photoresist and/or hard mask remnants, and post-ash residues are removed.

A two-step in-situ ash process in the current invention can alleviate many of the above shortcomings by satisfying at least one of: 1) minimizing cap layer consumption; 2) minimizing dielectric faceting/erosion at the top of features, and reducing post-etch/critical-dimension (CD) bias; 3) minimizing post-ash residues; 4) minimizing damage (reduction in "k" value) induced to low-k dielectric films during in-situ ash; and 5) providing automatic chamber dry cleaning, thereby increasing mean-time-between-chamber-cleaning.

Figure 2:
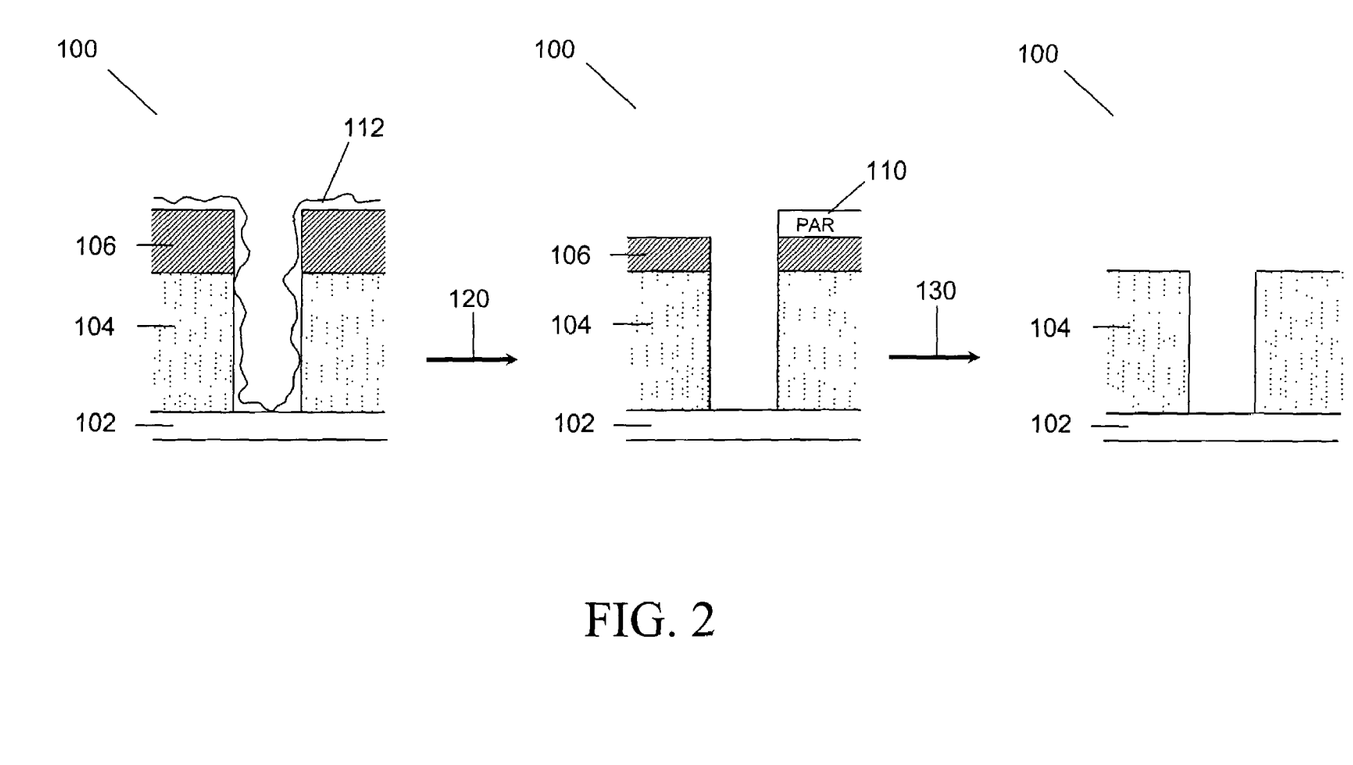
FIG. 2 shows an exemplary cross-sectional representation of a two-step ashing process.

FIG. 2 shows an exemplary cross-sectional representation of a two-step ashing process. During the first ashing step 120, of a two-step oxygen ash process, the photoresist 106 on the wafer, and fluorocarbon polymers 112 deposited on the chamber walls (not shown) and wafer are etched. As zero or low bias is applied, erosion of the dielectric layer 104 and consumption of the cap layer 102 are minimized. During the first ashing step 120, the chamber is dry cleaned of any polymer residues. The length of the first ashing step 120 can be based on time and can leave a small amount of post-ash residue 110 and possibly a small amount of photoresist 106 on the substrate.

During the second ashing step 130, bias is applied, and the ashing is carried out for a time sufficient to remove any post-ash residue 110 and any remaining photoresist 106.

The process parameter space for the two-step in-situ ash process can, for example, utilize a chamber pressure of 20–1000 mTorr, a process gas flow rate of 20–1000 sccm, a RF bias less than about 100 W in the first ashing step, and a RF bias greater than about 100 W in the second ashing step. Although a RF bias is disclosed as being used, a DC bias may also be used or may be used instead of a RF bias. Additionally, chamber pressure can be varied during the ashing process. For example, the chamber pressure can be varied from the first step to the second step. Furthermore, the composition of the process gas can be varied during the ashing process. For example, the process gas (and flow ratios of different gases in the process gas) can be varied from the first step to the second step. A process gas such as $O_2$ can be used alone, but it may also be used in conjunction with other gases (e.g., inert noble gases, such as He and Ar, and $N_2$).

Alternatively, during the two-step process, a bias can be applied when substantially all (but not all) of the polymer has been removed from the chamber in order to increase throughput, but at a cost of reintroducing some of the effects of the conventional one-step process.

Furthermore, although described above as using only a single bias, a varying bias can be used instead. For example, the bias may be increased (either continuously or stepwise (e.g., in increments of 10 W)) from 0 W to about 100 W, before, during, or after the second step.

As described above, the time duration for the first step should be sufficiently long to complete the removal of fluorocarbon material from the chamber walls and wafer surface. For example, the time duration for the first step can range from 10 sec to 100 sec. Preferably, the time duration for the first step ranges from 20 to 50 sec. Similarly, the time duration for the second step should be sufficiently long to remove any post-ash residue and any remaining photoresist. For example, the time duration for the second step can range from 10 sec to 100 sec. Preferably, the time duration for the second step ranges from 20 to 50 sec.

Alternatively, in the two-step ashing process in FIG. 2, the end of the first step 120 and the second step 130 can be determined using endpoint detection. One possible method of endpoint detection is to monitor a portion of the emitted light spectrum from the plasma region that indicates when all (or substantially all) of the polymer (and possibly the photoresist) has been removed from the chamber. For example, portions of the spectrum that indicate such a removal have wavelengths of 482.5 nm (CO), 775.5 nm (F), and 440 nm ($SiF_4$), and can be measured using Optical Emission Spectroscopy (OES). After emission levels corresponding to those frequencies cross a specified threshold (e.g., drop to substantially zero or increase above a particular level), the first step is considered to be complete. Other wavelengths that provide endpoint information can also be used.

After the end of the first step, the second step preferably utilizes a 50–200% overash to remove any remaining post-ash residue (PAR). That is, if the first step is completed in 50 sec, the second step would be 25 sec for a 50% overash and 50 sec for a 100% overash. The actual amount of overash can be determined empirically by examining a series of substrates that are overashed to different degrees.

Figure 3:
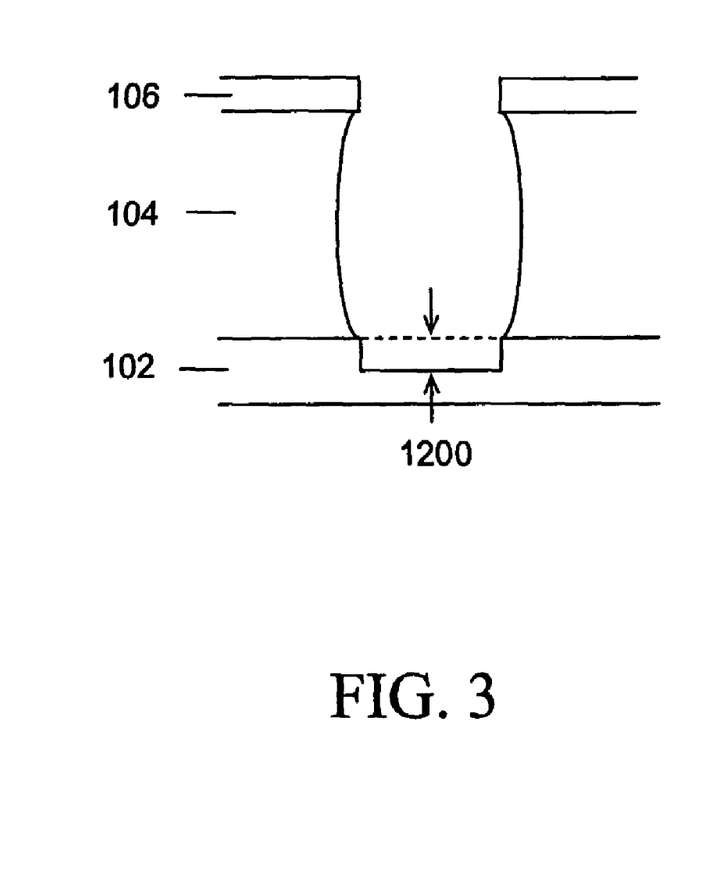
FIG. 3 schematically shows loss of a cap layer during an ash process.

In a first example, FIG. 3 schematically shows loss of cap layer 102 during an ash process. Cap layer loss 1200 is measured as the thinning of a cap layer in a scanning electron micrograph (SEM) image, following an ash process. The cap layer loss 1200 was measured for three ash processes: a) two-step ash in a chamber with polymer deposits (zero bias in the first step, increased bias in the second step); b) conventional one-step ash in a clean chamber; and c) conventional one-step ash in a chamber with polymer deposits.

The process conditions in these ash processes were:
a) First ash step: Chamber pressure=50 mTorr, RF bias=0 W, $O_2$ flow 200 sccm, Second ash step: Chamber pressure=20 mTorr, RF bias=150 W, $O_2$ flow=20 sccm, $Ar/O_2$ flows=200/20 sccm;
b) Chamber pressure=50 mTorr, RF bias=150 W, $O_2$ flow 200 sccm; and
c) Chamber pressure=50 mTorr, RF bias=150 W, $O_2$ flow 200 sccm.

A reduced cap layer loss 1200 is observed in the above two-step ash process (a), when compared to the one-step ash processes (b) and c)). For example, the cap layer loss decreases in the order c)>b)>a), as shown in TABLE 1. As a result, the two-step process provides an ash method that minimizes cap layer loss.

TABLE 1

| Ash process | Cap layers loss (nm) | |
|---|---|---|
| | Wafer Center | Wafer Edge |
| a | 18 | 18 |
| b | 24 | 24 |
| c | 36 | 36 |

Figure 4A:
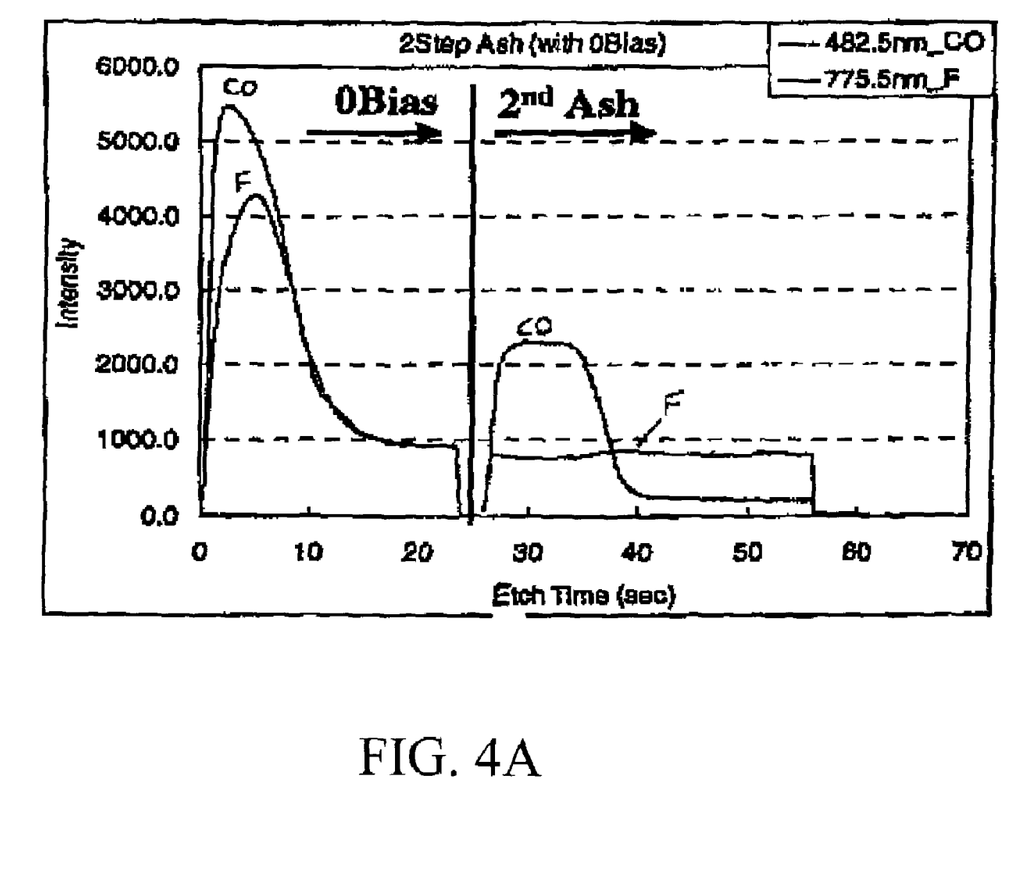
FIGS. 4A–4C show Optical Emission Spectroscopy (OES) graphs of ash processes.
Figure 4B:
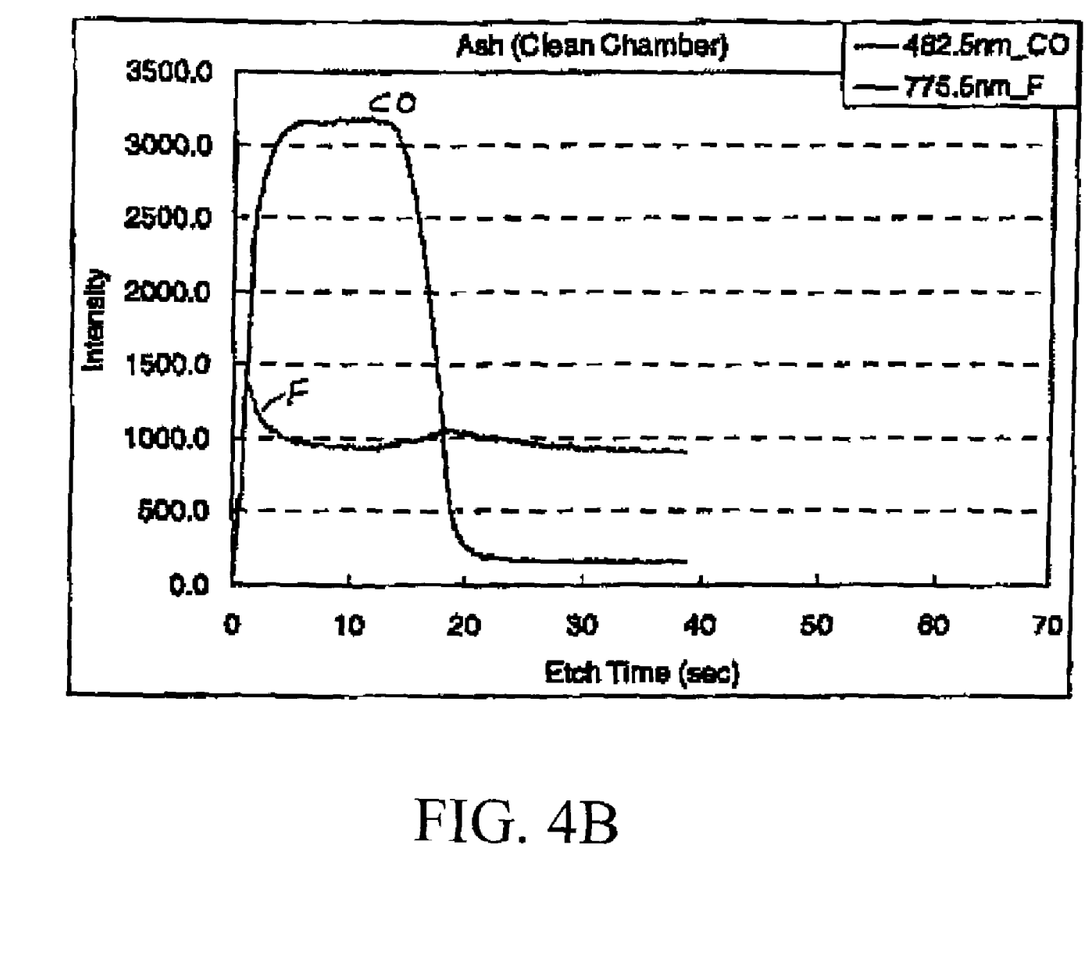
Figure 4C:
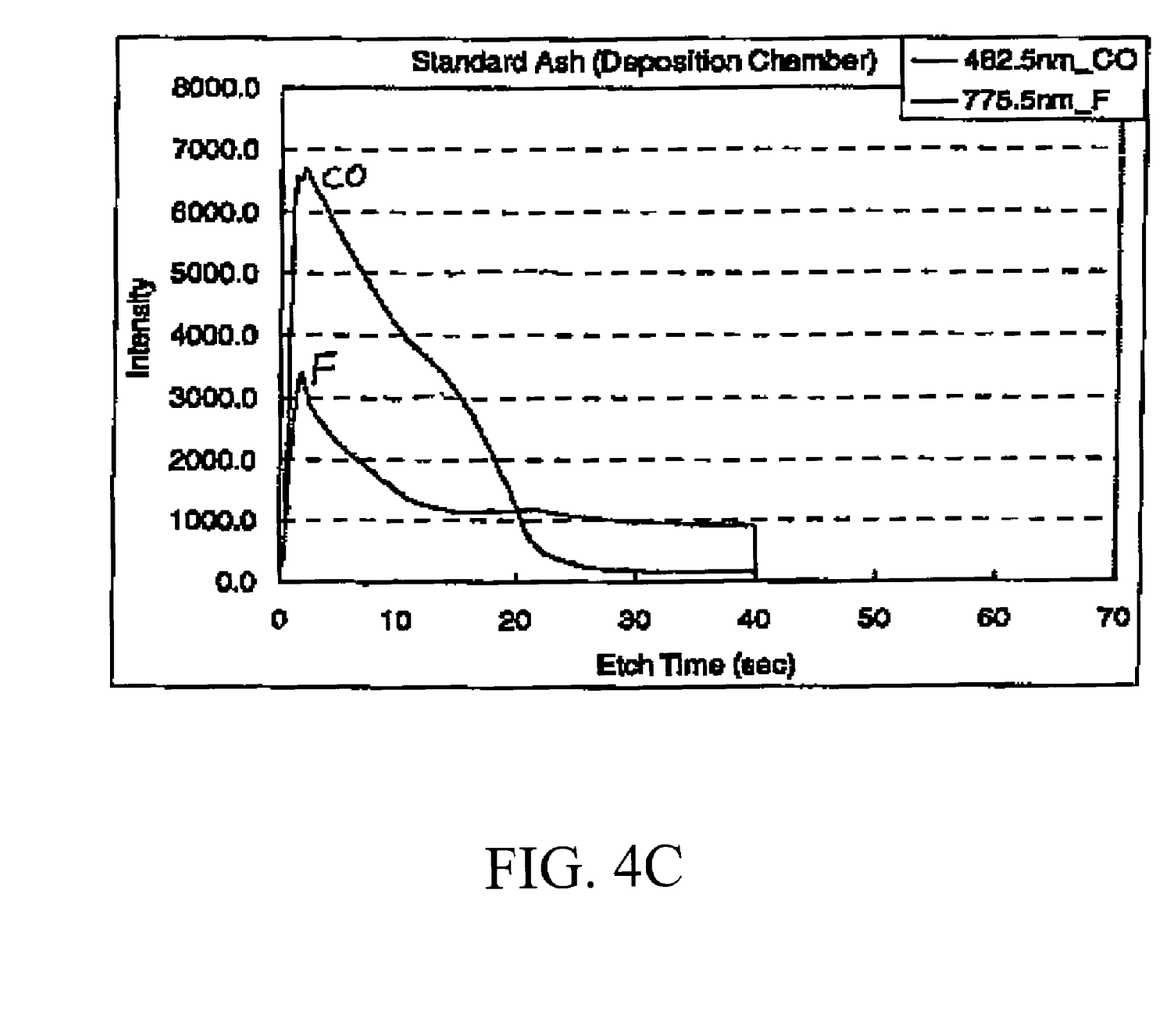

In a second example, FIGS. 4A–4C show OES graphs of ash processes. The release of fluorocarbon polymers from surfaces in the chamber (including the substrate surfaces) during the above processes can be monitored using OES. The OES graphs in FIGS. 4A–4C, correspond to the above-mentioned a)–c) ash processes, respectively. In FIG. 4A, a two-step ash process is carried out while monitoring emitted light signals that correspond to CO (482.5 nm) and F (775.5 nm) species. After an initial maximum intensity in the CO and F signals during the first ash step (zero bias applied), the two signals decrease monotonically thereafter, and show relatively low levels of CO and F species at the end of the first ash step. During the second ash step (bias applied), a low F signal level is maintained, but the CO signal shows a maximum intensity before reaching a new low level that is maintained for the remainder of the ash process. Importantly, the OES graph in FIG. 4A, shows that relatively low levels of CO and F species are reached before the end of the first ash step. Therefore, the F and CO signals (and/or other OES signals) can used to determine the end of the first ash step. The end of the second ash step in FIG. 4A can also be determined from the CO signal (and/or other OES signals).

FIG. 4B shows an OES graph during a conventional one-step ash process in a clean chamber. FIG. 4C shows an OES graph during a conventional one-step ash process in a chamber with polymer deposits. Large CO and F signals show high levels of these species during the ash process in the presence of a bias. Significantly reduced levels of CO and F are observed in FIG. 4B compared to FIG. 4C, but higher levels of CO and F are observed in FIG. 4C with bias on when compared to the first step of FIG. 4A when the bias is off.

Importantly, FIGS. 4A–4C illustrate that OES can be utilized to monitor the presence of a plasma species (e.g., F) that is detrimental to the ash process and can result in faceting of the dielectric layer and cap layer loss. Furthermore, OES can be utilized to determine the end of a plasma period where detrimental species are present in significant amounts in the plasma environment.

Damage to sidewalls of a dielectric layer that occurs during an ash process, is critical in semiconductor manufacturing. Following a plasma ash, the damage can be evaluated by measuring dielectric sidewall loss due to exposure to a HF etching solution.

Figure 5:
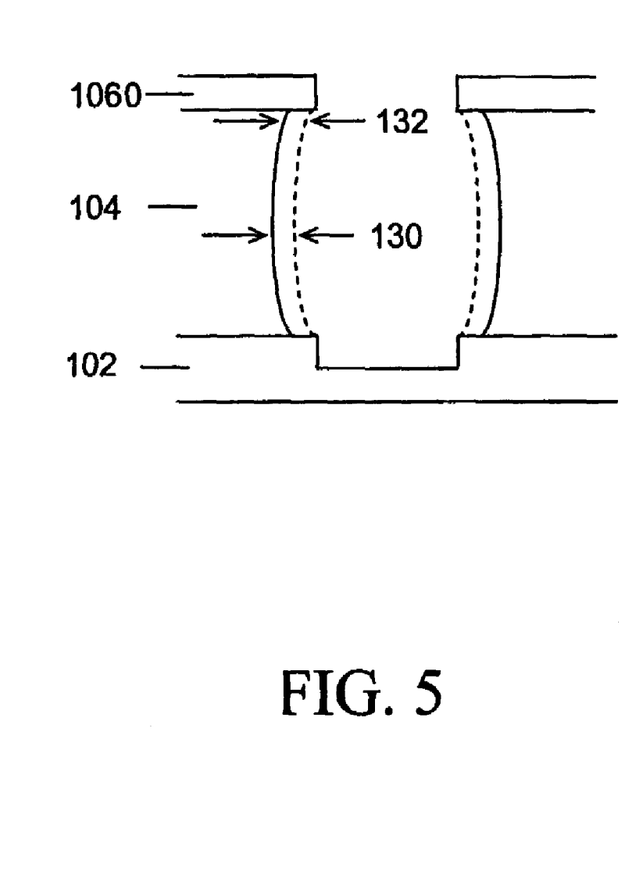
FIG. 5 schematically shows dielectric sidewall loss.

In a third example, FIG. 5 schematically shows dielectric sidewall loss. The dielectric sidewall loss in FIG. 5 is measured as removal at the top 132 and middle 130 of the dielectric layer 104 after exposure to a HF solution. The test structure in FIG. 5 further contained a SiN layer 1060 and a SiC layer 102. The dielectric sidewall loss was measured using each of the three abovementioned ash processes (a)–c), and in addition, using a d) two-step ash process at a lower total chamber pressure, and higher $O_2$ flow than the first ash step in process a).

The process conditions in ash process d) were: First ash step: Chamber pressure=20 mTorr, RF bias=0 W, $O_2$ flow 500 sccm; Second ash step: Chamber pressure=20 mTorr, RF bias=150 W, $O_2$ flow 20 sccm, Ar/$O_2$ flows=200/20 sccm.

The plasma ashed substrates were exposed to a 0.5% HF solution for 5 sec to 30 sec. SEM analysis of sidewall loss for a 30 sec HF exposure is shown in TABLE 2 for ashing processes a)–d). In summary, the dielectric sidewall loss (and therefore sidewall damage during the ash process) is less for the two-step ash process d) (where a lower chamber pressure and higher $O_2$ flow are utilized), than the two-step process a). In addition, the one-step process b), which was carried out in a clean chamber, shows less dielectric sidewall loss than one-step process c) and two-step process a), that were both carried out in chambers with polymer deposits.

TABLE 2

| Ash process | Sidewall 132 (nm) | | Sidewall loss 130 (nm) | |
|---|---|---|---|---|
| | Center | Edge | Center | Edge |
| a | 22.5 | 23.5 | 20.0 | 30.0 |
| b | 16.5 | 20.5 | 15.5 | 22.0 |
| c | 28.5 | 31.5 | 28.0 | 30.0 |
| d | 12.0 | 18.0 | 10.0 | 9.0 |

Numerous modifications and variations of the present invention are possible in light of the above teachings. It is therefore to be understood that, within the scope of the appended claims, the invention may be practiced otherwise than as specifically described herein.

The invention claimed is:

1. A method of in-situ ashing following an etching process which etches a feature through a dielectric layer to an underlying cap layer of a substrate, the method comprising:
   introducing a process gas containing an oxygen-containing gas;
   generating a plasma in a plasma processing chamber;
   exposing the substrate to the plasma, the substrate residing on top of a substrate holder;
   performing a first ashing step to remove etch products from at least the cap layer within the feature by applying a first bias to the substrate holder at a total chamber pressure of less than 50 mTorr and a flow rate of the process gas more than 200 sccm; and
   performing a second ashing step by applying a second bias to the substrate holder, the second bias being greater than the first bias, wherein the cap layer comprises SiN or SiC.

2. The method according to claim 1, wherein the oxygen-containing gas comprises $O_2$.

3. The method according to claim 1, wherein the process gas further comprises an inert gas.

4. The method according to claim 3, wherein the inert gas comprises at least one of He, Ar, and $N_2$.

5. The method according to claim 1, wherein the first bias is less than about 100 W and the second bias is greater than about 100 W.

6. The method according to claim 1, wherein the first bias is less than about 50 W.

7. The method according to claim 1, wherein the first bias is substantially equal to zero.

8. The method according to claim 1, wherein the second bias is greater than 120 W.

9. The method according to claim 1, wherein the second ashing step further comprises utilizing in the second ashing step at least one of chamber pressure, and rate of process gas flow different from the first ashing step.

10. The method according to claim 1, wherein the first ashing step further comprises:
 detecting emitted light from the plasma; and
 determining the status of the first ashing step from the emitted light.

11. The method according to claim 10, wherein the detection of the emitted light provides means for establishing an endpoint.

12. The method according to claim 10, wherein the emitted light originates from an excited species and represents information on the status of the first ashing step.

13. The method according to claim 10, wherein the emitted light originates from at least one of CO and a fluorine-containing species.

14. The method according to claim 13, wherein the fluorine-containing species is fluorine.

15. The method according to claim 1, wherein the second ashing step further comprises:
 detecting emitted light from the plasma; and
 determining the status of the second ashing step from the emitted light.

16. The method according to claim 15, wherein the emitted light originates from an excited species and represents information on the status of the second ashing step.

17. The method according to claim 16, wherein the emitted light originates from at least one of CO and a fluorine-containing species.

18. The method according to claim 17, wherein the fluorine-containing species is fluorine.

19. The method according to claim 1, further comprising:
 detecting emitted light from the plasma; and
 determining a status of the first and second ashing steps from the emitted light.

20. The method according to claim 19, wherein the emitted light originates from an excited species and represents information on the status of the first and second ashing steps.

21. The method according to claim 19, wherein the emitted light originates from at least one of CO and a fluorine-containing species.

22. The method according to claim 21, wherein the fluorine-containing species is fluorine.

23. The method according to claim 1, wherein the length of the second ashing step is between 50% and 200% of the length of the first ashing step.

24. The method according to claim 1, wherein the process gas consists of $O_2$ during at least the first ashing step and has a flow rate of 500 sccm.

25. The method according to claim 24, wherein the process gas consists of $O_2$ and an inert gas during the second ashing step.

26. The method according to claim 25, wherein the process gas consists of $O_2$ and Argon during the second ashing step and the flow rate of $O_2$ is 20 sccm and the flow rate of Argon is 200 sccm.

27. The method according to claim 1, wherein the flow rate of the process gas in the second ashing step is between 20 sccm and 1000 sccm.

28. The method according to claim 1, wherein the flow rate of the process gas is varied between the first and second ashing steps.

29. The method according to claim 1, wherein pressure in the processing chamber in the first ashing step is 20 mTorr or more and less than 50 mTorr.

30. The method according to claim 29, wherein the pressure in the processing chamber in the second ashing step is between 20 mTorr or more and 1000 mTorr or less.

31. The method according to claim 30, wherein the pressure in the processing chamber is 20 mTorr during the first and second ashing steps.

32. A method of in-situ processing, comprising:
 introducing a process gas containing an oxygen-containing gas;
 generating a plasma in a plasma processing chamber;
 exposing a substrate to the plasma, the substrate residing on top of a substrate holder;
 performing a cleaning step by applying a first bias to the substrate holder while a total pressure of the plasma processing chamber is less than 50 mTorr and a flow rate of the process gas is more than 200 sccm;
 increasing the first bias to a second bias greater than the first bias; and
 performing an ashing step while applying the second bias to the substrate holder.

33. The method of claim 32, wherein said step of increasing is performed during both of the cleaning step and the ashing step.

34. The method of claim 32, wherein said step of increasing comprises incrementally increasing the bias from said first bias to said second bias.

35. The method of claim 32, wherein said step of increasing comprises continuously increasing the bias from said first bias to said second bias.

36. The method of claim 1, further comprising introducing another process gas during said second ashing step, the another process gas having a different composition than said process gas.

37. The method of claim 32, further comprising introducing another process gas during said ashing step, the another process gas having a different composition than said process gas.

38. The method of claim 1, wherein:
 the process gas consists of $O_2$ during the first ashing step and consists of $O_2$ and Argon during the second ashing step;
 the first ashing step is performed at a first bias of 0 W, a total chamber of 20 mTorr and an $O_2$ flow rate of 500 sccm; and
 the second ashing step is performed at a second bias of 150 W, a total chamber pressure of 20 mTorr, an Argon flow rate of 200 sccm and an $O_2$ flow rate of 20 sccm.

* * * * *